United States Patent
Loong

(10) Patent No.: US 10,964,499 B2
(45) Date of Patent: Mar. 30, 2021

(54) DETECTION CIRCUIT MODULE FOR USE IN DETECTING AN OPERATIONAL STATUS OF A HOUSEHOLD APPLIANCE DOOR

(71) Applicants: Defond Electech Co., Ltd., Guangdong (CN); Defond Components Limited, Chai Wan (HK)

(72) Inventor: Chiu Keung Loong, Chai Wan (HK)

(73) Assignees: Defond Electech Co., Ltd., Guangdong (CN); Defond Components Limited, Chai Wan (HK)

(*) Notice: Subject to any disclaimer, the term of this patent is extended or adjusted under 35 U.S.C. 154(b) by 0 days.

(21) Appl. No.: 16/207,397

(22) Filed: Dec. 3, 2018

(65) Prior Publication Data
US 2019/0172670 A1    Jun. 6, 2019

Related U.S. Application Data

(60) Provisional application No. 62/595,318, filed on Dec. 6, 2017.

(51) Int. Cl.
*H01H 47/00* (2006.01)
*E05B 47/00* (2006.01)
(Continued)

(52) U.S. Cl.
CPC ........... *H01H 47/002* (2013.01); *D06F 39/14* (2013.01); *G01R 31/50* (2020.01); *H01H 47/223* (2013.01);
(Continued)

(58) Field of Classification Search
CPC .... G01R 31/026; G01R 31/50; H01H 47/002; H01H 47/223; D06F 33/00; D06F 37/42; D06F 39/14
See application file for complete search history.

(56) References Cited

U.S. PATENT DOCUMENTS

| 3,626,403 | A | * | 12/1971 | Ive | G08B 13/08 340/521 |
| 2017/0004933 | A1 | * | 1/2017 | Rocchitelli | H01H 3/163 |
| 2017/0058566 | A1 | | 3/2017 | Rocchitelli | |

FOREIGN PATENT DOCUMENTS

| CN | 106163361 A | 11/2016 |
| CN | 106165045 A | 11/2016 |

(Continued)

OTHER PUBLICATIONS

European Patent Office, "Extended European Search Report" in connection with related European Patent Application No. 18209833.5, dated Mar. 26, 2019, 7 pgs.

*Primary Examiner* — Minh N Tang
(74) *Attorney, Agent, or Firm* — Kolisch Hartwell, P.C.

(57) ABSTRACT

A detection circuit module for use with a household appliance door to detect when the door is closed and/or locked, the detection circuit module having a first and a second contact configured for electrical connection with the household appliance door so as to be operable with the household appliance door, the detection circuit module including: a door closing switch arranged electrically in series between the first connecting contact and an actuator; a door locking switch arranged electrically in series between the actuator member and the second connecting contact; and a diode arranged in series with the actuator and the second connecting contact and the diode being arranged electrically in parallel with the door locking switch.

5 Claims, 7 Drawing Sheets

(51) Int. Cl.
    *H01H 47/22*     (2006.01)
    *D06F 39/14*     (2006.01)
    *G01R 31/50*     (2020.01)
    *D06F 37/42*     (2006.01)
    *D06F 33/00*     (2020.01)

(52) U.S. Cl.
    CPC .............. *D06F 33/00* (2013.01); *D06F 37/42* (2013.01); *D06F 2204/10* (2013.01); *D06F 2224/00* (2013.01)

(56) References Cited

FOREIGN PATENT DOCUMENTS

| | | | |
|---|---|---|---|
| EP | 3103128 | A1 | 12/2016 |
| EP | 3104763 | A1 | 12/2016 |

* cited by examiner

DETECTION CIRCUIT MODULE FOR USE IN DETECTING AN OPERATIONAL STATUS OF A HOUSEHOLD APPLIANCE DOOR

TECHNICAL FIELD

The present invention relates to electric circuit modules for detecting the operational status of a door of a household appliance such as washing machine, dryer and the like.

BACKGROUND OF THE INVENTION

Washing machines, dryers and other such household appliances may typically comprise a door locking mechanism having an electric circuit module configured for detecting when the door is closed as well as when the door is locked. Certain electric circuit modules used in such appliances tend to be susceptible to inaccuracy in detection of the door closed and/or door locked state which may compromise operation of the household appliance in use. Accordingly, there is a perceived need to improve the reliability of the detection mechanism to alleviate such problems from arising.

SUMMARY OF THE INVENTION

The present invention seeks to alleviate at least one of the above-described problems.

The present invention may involve several broad forms. Embodiments of the present invention may include one or any combination of the different broad forms herein described.

In one broad form, the present invention provides a detection circuit module for use with a household appliance door to detect when the door is closed and/or locked, said detection circuit module having a first and a second contact configured for electrical connection with the household appliance door so as to be operable with the household appliance door, the detection circuit module including: a door closing switch arranged electrically in series between the first connecting contact and an actuator; a door locking switch arranged electrically in series between the actuator member and the second connecting contact; and a diode arranged in series with the actuator and the second connecting contact and said diode being arranged electrically in parallel with the door locking switch.

Preferably, the actuator may include an electro-mechanical actuator.

Preferably, the electro-mechanical actuator may include a solenoid actuator.

Preferably, a plurality of diodes may be arranged between the actuator and the second connecting contact, said plurality of diodes being arranged electrically in series with each other and said plurality of diodes being arranged in parallel with the door locking switch.

Preferably, the present invention may include a controller circuit module configured for outputting a sequence of electrical pulse signals via an output signal pin, said detection circuit module being operable by reference to sequence of electrical pulse signals to detect the status of the door closing switch and the door locking switch.

BRIEF DESCRIPTION OF THE DRAWINGS

The present invention will become more fully understood from the following detailed description of a preferred but non-limiting embodiments thereof, described in connection with the accompanying drawings, wherein.

DETAILED DESCRIPTION OF THE PREFERRED EMBODIMENTS

Figure 1:
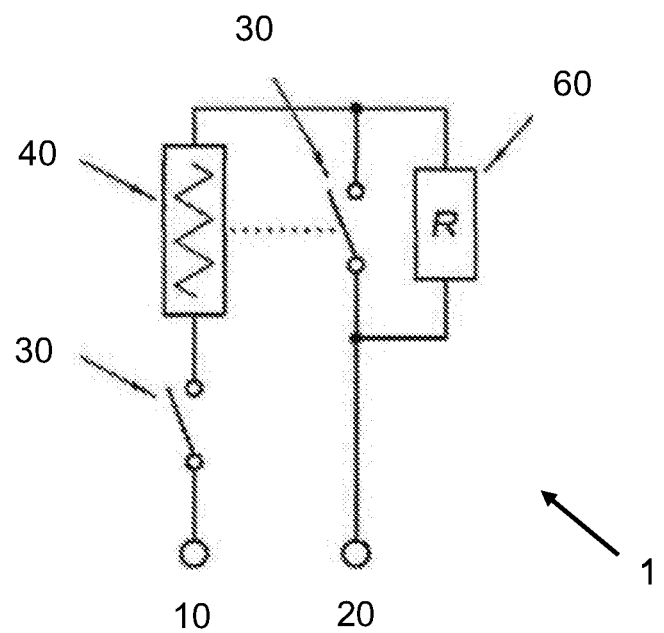
FIG. 1 depicts a prior art electric circuit for detecting an operating state of a household appliance door.

FIG. 1 shows a prior art detection circuit (1) for use with a household appliance door in which the detection circuit has a first contact (10) and a second contact (20) configured for electrical connection with the household appliance door so as to be operable with the household appliance door to detect when the door is closed and/or locked. The detection circuit (1) includes a door closing switch (30) arranged electrically in series between the first connecting contact and a solenoid actuator valve (40). The solenoid actuator valve (40) may consist of a moving portion that is movable in response to current flowing through a coil of the solenoid actuator valve.

The prior art device also includes a door locking switch (50) arranged electrically in series between the actuator (40) and the second connecting contact (20). A resistor/PTC element (60) is arranged between the actuator (40) and the second connecting contact (20) with the resistor/PTC element (60) being arranged electrically in parallel with the door locking switch (50). The resistor/PTC element (60) is a ceramic element configured for protecting the solenoid actuator valve (40) from overloading during operation.

The prior art device (1) is configured to be used to detect when the door lock switch is in an opened state (indicating the door being unlocked) or a closed state (indicating the door being locked) by reference to variations in voltage across the contacts (20,10) or by reference to current running through the detection circuit due to variations in the overall impedance (i.e. reactance and/or resistance) of the solenoid actuator in series with the resistor/PTC element when the door lock switch is either opened or closed. For instance, if the voltage or current is determined to be greater than a predetermined threshold value programmed in to a control module circuit, the state of the door lock switch is able to be determined and appropriate control signals transmitted by the control circuit module to lock or unlock the door.

Notably, the prior art device (1) is implemented using analog circuit elements (e.g. resistor or PTC element) to compare the voltage or current against a threshold value. As such, a regulated voltage or a compensation circuit is also required in practice to ensure that a correct door lock switch status is able to be detected by the prior art device in view of inherent fluctuations in the power supply voltage applied to the circuit. It would be appreciated form the above that the prior art analog circuit element tends to be susceptible to producing inaccurate readings, additional circuitry is required to try and alleviate such inaccuracies which introduces manufacturing time, complexity and cost, and which tends to be less energy efficient in use.

Referring now to FIGS. 2 to 7, various embodiments (2) of the present invention are now shown comprising an improved detection circuit module for use with a household appliance door to detect when the door is closed and/or locked. The detection circuit module (2) includes a first contact (10A) and a second contact (20A) configured for electrical connection with the household appliance door so as to be operable therewith. The detection circuit module (2) includes a door closing switch (30A) arranged electrically in series between the first connecting contact (10A) and a solenoid actuator valve (40A). The detection circuit module (2) also includes a door locking switch (50A) arranged electrically in series between the solenoid actuator (40A) and the second connecting contact (20A). A diode (60A) is arranged between the solenoid actuator (40A) and the second connecting contact (20A) with the diode (60A) being arranged electrically in parallel with the door locking switch (50A). Advantageously, the use of the diode (60A) in this context improves the reliability and accuracy of detecting the operational status of the household appliance door as the diode (60A) operates digitally according to discrete operational states whereby current will either be flowing through the diode (60A) or not and discrete voltage levels will be more accurately detectable across the diode (60A) and across the detection circuit module (2) in use to indicate the door operational status. Furthermore, the embodiments of the present invention may tend to be more energy efficient due to the use of the diode (60A) element instead of a resistor/PTC type element as used in the prior art.

Figure 2:
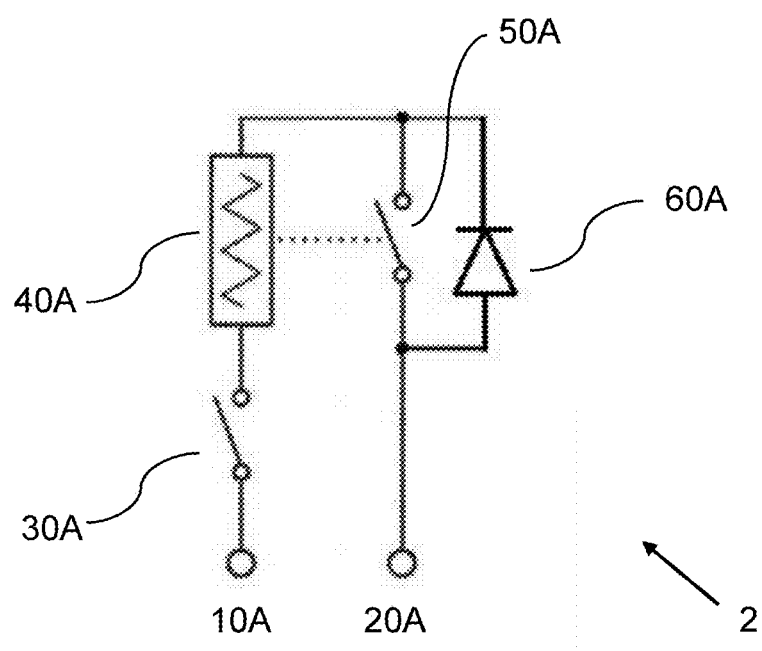
FIG. 2 depicts one embodiment of the present invention comprising an improved detection circuit module for detecting an operational status of a household appliance door, the embodiment having a diode element arranged in a first direction.
Figure 3:
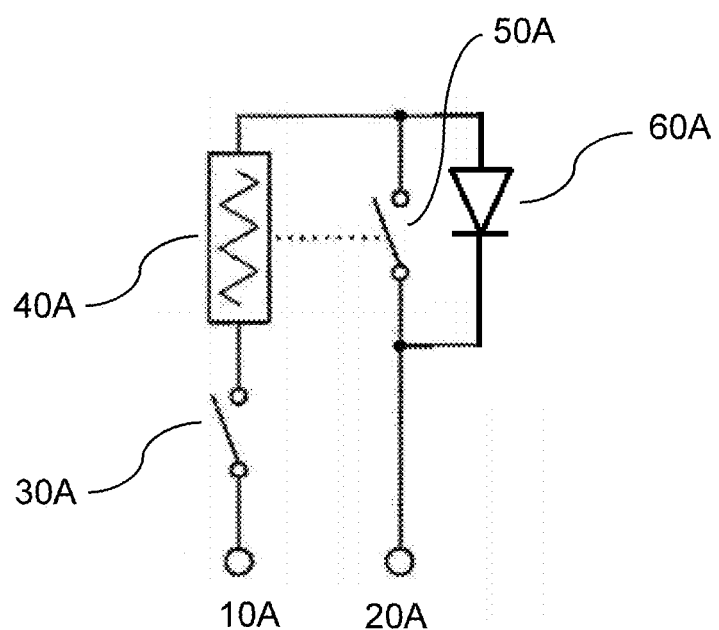
FIG. 3 depicts another embodiment of the present invention comprising an improved detection circuit module for detecting an operational status of a household appliance door, the embodiment having a diode element arranged in a reverse direction to that shown in FIG. 2.
Figure 4:
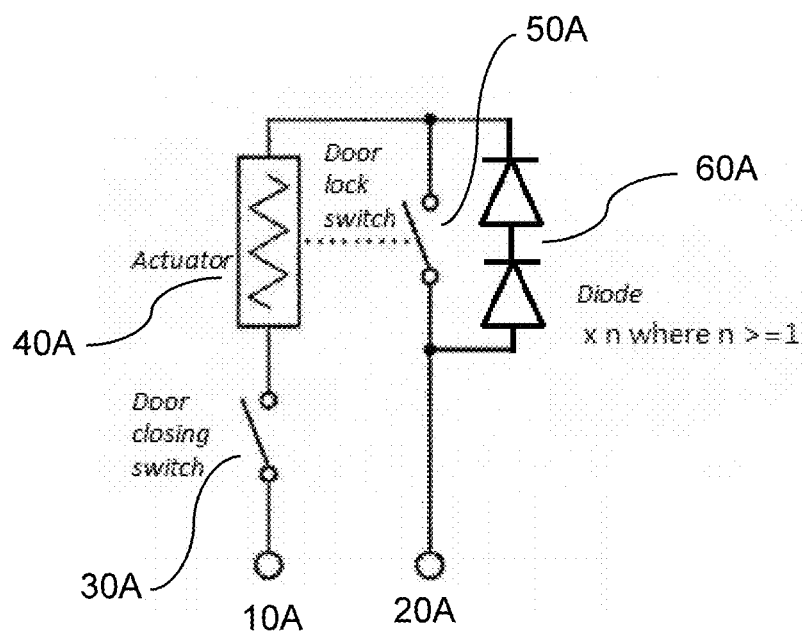
FIG. 4 depicts another embodiment of the present invention comprising an improved detection circuit module for detecting an operational status of a household appliance door, the embodiment having multiple diode elements arranged in series along the same branch of the circuit in parallel with the door locking switch.
Figure 5:
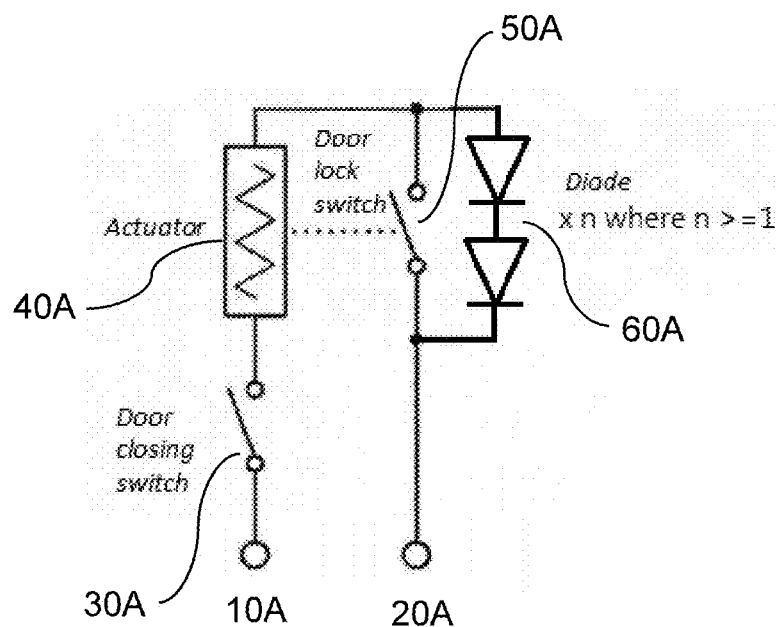
FIG. 5 depicts another embodiment of the present invention comprising an improved detection circuit module for detecting an operational status of a household appliance door, the embodiment having multiple diode elements arranged in series along the same branch of the circuit in parallel with the door locking switch and with the diodes arranged in a reverse direction to that shown in the embodiment of FIG. 4.

Further, as shown in FIGS. 2 and 3, the diode (60A) may be arranged electrically to operate in different directions within the detection circuit module (2) depending upon polarity of operation and/or whether full wave or half wave cycles of the power supply (80A) will be utilised for detection of the door locking switch (50A) open or closed state. Further, multiple diodes (60A) may be arranged in series within the same branch of the detection circuit module (2) as shown in FIGS. 4 and 5 with diodes (60A) arranged in different directions to assist in alleviating susceptibility to surge voltage, if any. In such embodiments, the operation of the detection circuit module (2) is the same as in the case of single diode embodiments except that the forward voltage of the resultant multiple diode is increased. Advantageously the use of multiple diodes (60A) in certain embodiments may also provide redundancy in case of component failure of one of the diode elements (60A).

Figure 6:
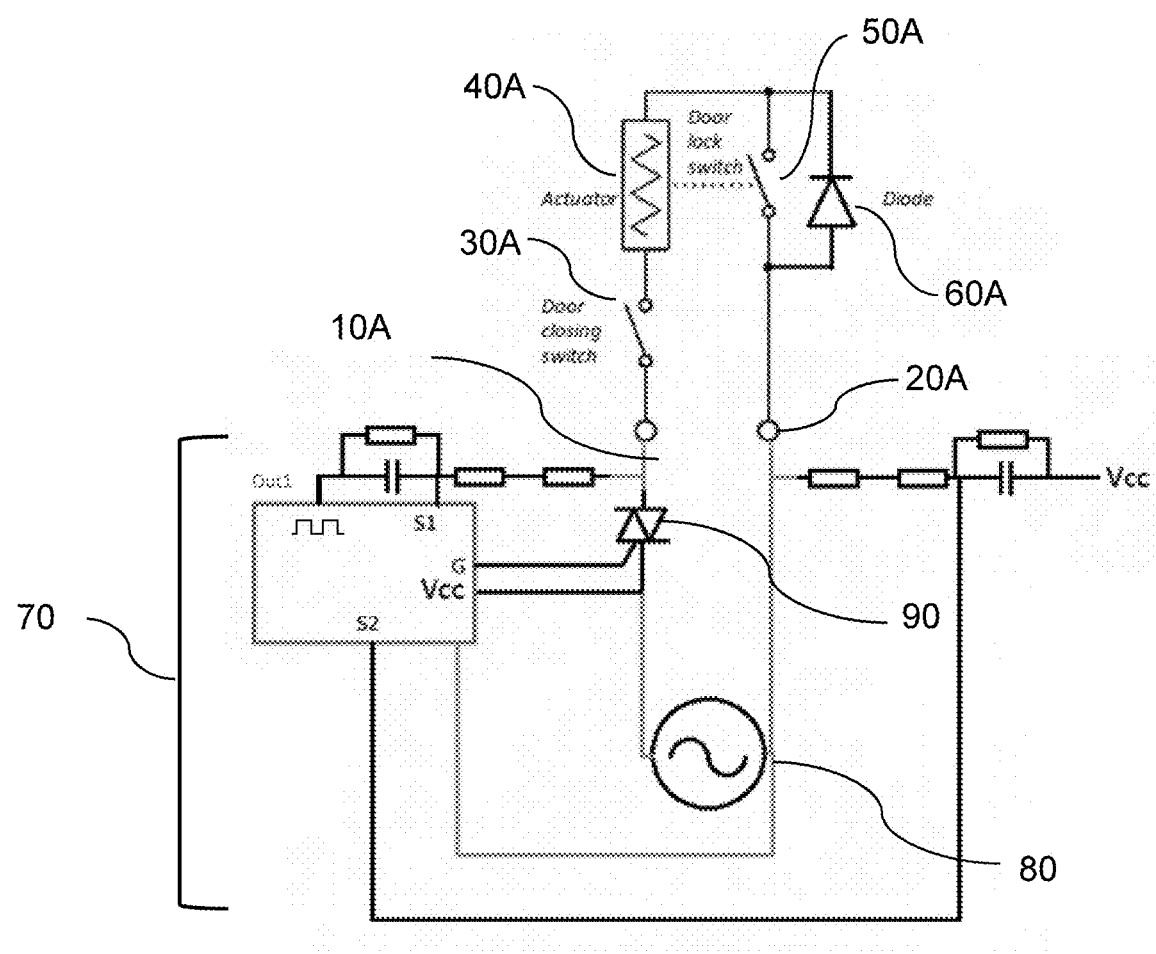
FIG. 6 depicts another embodiment of the present invention comprising an improved detection circuit module for detecting an operational status of a household appliance door, and, a control circuit module electrically connected to the door lock circuit for use in outputting a sequence of electrical pulse signals for controlling operation of the detection circuit module.
Figure 7:
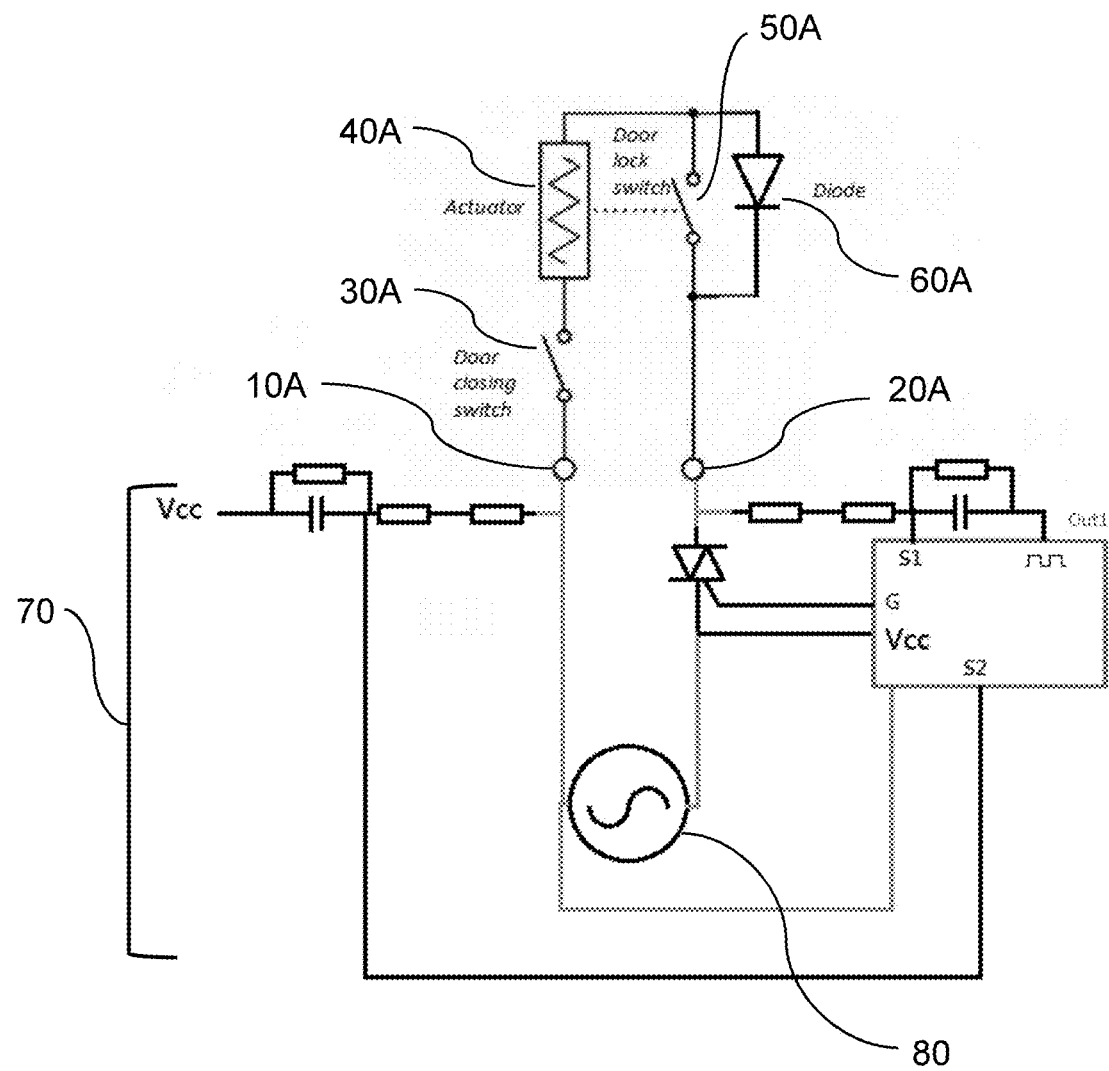
FIG. 7 depicts yet another embodiment of the present invention comprising an improved detection circuit module for detecting an operational status of a household appliance door, and, a control circuit module electrically connected to the detection circuit module and configured for outputting a sequence of electrical pulse signals for controlling operation of the detection circuit module.

Referring now to FIGS. 6 and 7, a control circuit module (70) is shown operably connected with the detection circuit module (2). The control circuit module (70) is configured for controlling the detection circuit module (2) to detect the door closed and/or door locked status. The control circuit module (70) outputs a sequence of electrical pulse signals via output pin Out1. The detection circuit module (2) is operable by reference to the sequence of electrical pulse signals to detect the operational status of the household appliance door (i.e. whether it is closed, opened, locked, unlocked). The control circuit module (70) is electrically connected to the detection circuit module (2) with the diode (60A) element arranged electrically in different directions. In these embodiments, if the door closing switch (30A) is arranged in an opened state this indicate that the door has not been closed and the signal at pin S1 signal follows the signal at pin Out1. If the door of the household appliance is closed, the door closing switch (30A) is arranged in a closed state and the signal at pin S1 will be high at a positive cycle of the AC power source (80) applied across the second and first connecting contacts (20,10). If the door locking switch (50A) is open and door closing switch (30A) is closed, pin S1 will follow the signal output at pin Out1 of the control circuit module (70) at a negative cycle of the AC power source (80) applied across the second and first connecting contacts (20, 10). The control circuit module (70) could lock the door by turning on the solid state device (90) once (pulse) to energise the solenoid actuator (40A) for a period which in turn is configured to effect closure of the door locking switch (50A) with which the door is locked. If the door locking switch (50A) is set in a closed state, the signal at pin S1 will be low at a negative cycle of the power source (80) applied across contacts second and first connecting contacts (20,10). The control circuit module (70) toggles the door lock state from a locked to an unlocked state by turning on the solid state device (90) or switching means (such as relay) once (pulse) to energise the solenoid actuator (40A) for a period which turn is configured to effect opening of the door locking switch (50A) with which the door is unlocked. The control circuit module (70) also includes an input signal pin (S2) with zero crossing circuit for detecting the period with positive cycle of the AC power source (80) and the period of negative cycle of the AC power source (80)

Although the use of a diode (60A) any similar component configured for providing similar operation may be used in substitute for the diode in alternative embodiments.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A detection circuit module for use with a household appliance door to detect when the door is closed and/or locked, said detection circuit module having a first and a second contact configured for electrical connection with the household appliance door so as to be operable with the household appliance door, the detection circuit module including:
   a door closing switch arranged electrically in series between the first contact and an actuator;
   a door locking switch arranged electrically in series between the actuator and the second contact; and
   a diode arranged in series with the actuator and the second contact and said diode being arranged electrically in parallel with the door locking switch; and
   wherein said detection circuit module is configured for being driven by an AC power supply and said diode is configurable for arrangement electrically in different directions within the detection circuit module in order to detect when the door is closed and/or locked.

2. A detection circuit module as claimed in 1 wherein, said actuator includes an electro-mechanical actuator.

3. A detection circuit module as claimed in claim 2 wherein the electro-mechanical actuator includes a solenoid actuator.

4. A detection circuit module as claimed in claim 1 including a plurality of diodes arranged between the actuator and the second contact, said plurality of diodes being arranged electrically in series with each other and said plurality of diodes being arranged in parallel with the door locking switch.

5. A detection circuit module as claimed in claim 1 including a controller circuit module configured for outputting a sequence of electrical pulse signals via an output signal pin, said detection circuit module being operable by reference to the sequence of electrical pulse signals to detect the status of the door closing switch and the door locking switch.

* * * * *